(12) United States Patent
White

(10) Patent No.: US 10,539,178 B2
(45) Date of Patent: Jan. 21, 2020

(54) VAPOR DEPOSITION BEARING COATING

(71) Applicant: Schaeffler Technologies AG & Co. KG, Herzogenaurach (DE)

(72) Inventor: Michael White, Lake Wylie, SC (US)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 264 days.

(21) Appl. No.: 15/599,016

(22) Filed: May 18, 2017

(65) Prior Publication Data

US 2018/0335090 A1 Nov. 22, 2018

(51) Int. Cl.
*F16C 19/52* (2006.01)
*C23C 14/22* (2006.01)
*B32B 15/20* (2006.01)

(52) U.S. Cl.
CPC .............. *F16C 19/52* (2013.01); *B32B 15/20* (2013.01); *C23C 14/22* (2013.01)

(58) Field of Classification Search
None
See application file for complete search history.

(56) References Cited

U.S. PATENT DOCUMENTS

| | | |
|---|---|---|
| 1,152,680 A | 9/1915 | Wieselgreen |
| 3,924,906 A | 12/1975 | Kitaoka |
| 4,417,954 A | 11/1983 | Birkle et al. |
| 5,059,041 A | 10/1991 | Watanabe et al. |
| 6,062,735 A * | 5/2000 | Ward ..................... F16C 23/084 384/492 |
| 7,878,814 B2 | 2/2011 | Chin et al. |
| 8,248,725 B2 | 8/2012 | Hendriks et al. |
| 2008/0241517 A1* | 10/2008 | Kenworthy ............. B32B 15/01 428/332 |
| 2011/0186131 A1* | 8/2011 | Mukai ................... B32B 15/012 136/264 |
| 2013/0209006 A1 | 8/2013 | Kolev et al. |
| 2015/0036959 A1* | 2/2015 | Strian ..................... F16C 19/04 384/513 |
| 2017/0284468 A1 | 10/2017 | White |

FOREIGN PATENT DOCUMENTS

| | | | |
|---|---|---|---|
| DE | 4038139 A1 * | 6/1992 | ............... C25D 7/10 |
| EP | 2628822 A1 | 8/2013 | |

OTHER PUBLICATIONS

Machine Translation of DE 4038139 A1 (Year: 1992).*

* cited by examiner

*Primary Examiner* — Shamim Ahmed
*Assistant Examiner* — Bradford M Gates
(74) *Attorney, Agent, or Firm* — Volpe and Koenig, P.C.

(57) ABSTRACT

A method of providing electrical discharge machining protection for a bearing is provided. The method includes (a) providing a bearing ring, (b) ionizing pure aluminum and depositing a pure aluminum layer on at least a portion of the bearing ring, (c) immersing the bearing ring in acid to convert the pure aluminum layer to an aluminum oxide layer, and (d) immersing the bearing ring in deionized water to seal the aluminum oxide layer.

13 Claims, 3 Drawing Sheets

VAPOR DEPOSITION BEARING COATING

FIELD OF INVENTION

This application is generally related to a bearing, and is more particularly related to electrical discharge machining (EDM) protection for a bearing.

BACKGROUND

Bearings are widely used in various mechanical applications, including automotive and industrial applications. Grounding devices and bearing coatings are used in bearings to prevent shaft induced currents from causing EDM due to electrical currents passing through a rolling bearing component. EDM causes pitting, fluting, and fusion craters in the rolling contact areas of the bearing components resulting in premature rolling bearing failure. Known EDM prevention methods include di-electric ceramic bearing coatings, Faraday shields, electrically conductive bearing grease, and shaft-contacting ground brushes.

Known di-electric ceramic bearing coatings include a hard brittle coating that can fracture during installation or running. Cracks in the coating allow current to pass through the bearing which results in EDM. Di-electric ceramic bearing coatings also have limited di-electric strength and at high voltage potential, current can pass through the coating structure compromising the EDM protection of the coating.

Known Faraday shields are disclosed in U.S. Pat. No. 7,878,814. Faraday shields are expensive to implement in most rolling bearing applications. Electrically conductive grease or liquid metal, such as disclosed in U.S. Pat. No. 8,248,725, are used to allow current to continuously pass through bearing surfaces but may contain elements such as copper, carbon, or phosphorous which can cause excessive wear on the bearing surfaces and lead to premature failure of the rolling bearing.

Spring loaded shaft grounding brushes allow a continuous flow of current to ground to prevent EDM on the adjacent bearing. Known grounding brushes are prone to excessive wear, material transfer, and oxide formation on the mating surface. These oxides may become a di-electric and may prevent effective current transfer from the shaft to the ground. In addition to bearing EDM, this can cause electrical arcing and lead to damage of the shaft. Once the impedance of the shaft grounding brush exceeds the impedance of the bearings, the current can seek ground through the bearings which can potentially cause EDM damage to the bearings. Shaft grounding brushes may also vibrate due to imperfections in the shaft surface, i.e. an out of round condition. When the grounding brush momentarily loses contact with the shaft during vibration, the current can arc from the grounding brush to the shaft causing EDM damage. Alternatively, the current can flow through the bearings if the voltage potential is sufficiently high while the brush loses contact with the shaft during vibration. Traditional spring loaded shaft grounding brushes are also prone to rapid and excessive wear and can ultimately lose contact with the shaft causing the current to seek ground through the bearing and causing EDM damage in the bearing.

Each of these known EDM protection features has drawbacks, and it would be desirable to provide cost effective and reliable EDM protection for rolling bearing components that avoids these drawbacks.

SUMMARY

A method of providing EDM protection for a bearing through the use of a coating of aluminum oxide is provided. The method includes (a) providing a bearing ring, (b) ionizing pure aluminum and depositing a pure aluminum layer on at least a portion of the bearing ring, (c) immersing the bearing ring in acid to convert the pure aluminum layer to an aluminum oxide layer, and (d) immersing the bearing ring in deionized water to seal the aluminum oxide layer. The aluminum oxide layer is only provided on a surface area of the bearing ring away from the raceway.

In another embodiment, a rolling bearing assembly including an inner bearing ring or an outer bearing ring with EDM protection is provided. Pure aluminum is ionized and deposited onto a portion of the inner bearing or the outer bearing ring. Next, the inner bearing or the outer bearing ring is immersed in acid to convert the pure aluminum layer to an aluminum oxide layer. The inner bearing or the outer bearing ring is then immersed in deionized water to seal the aluminum oxide layer.

In one embodiment, the raceway of the bearing ring is masked or shielded to prevent the deposition of aluminum and the formation of aluminum oxide.

In another embodiment, the raceway of the bearing ring is machined after the deposition of the aluminum and the formation of aluminum oxide to remove these layers from the raceway.

Preferred arrangements with one or more features of the invention are described below and in the claims.

BRIEF DESCRIPTION OF THE DRAWINGS

The foregoing Summary as well as the following Detailed Description will be best understood when read in conjunction with the appended drawings. In the drawings.

DETAILED DESCRIPTION OF THE PREFERRED EMBODIMENTS

Figure 1:
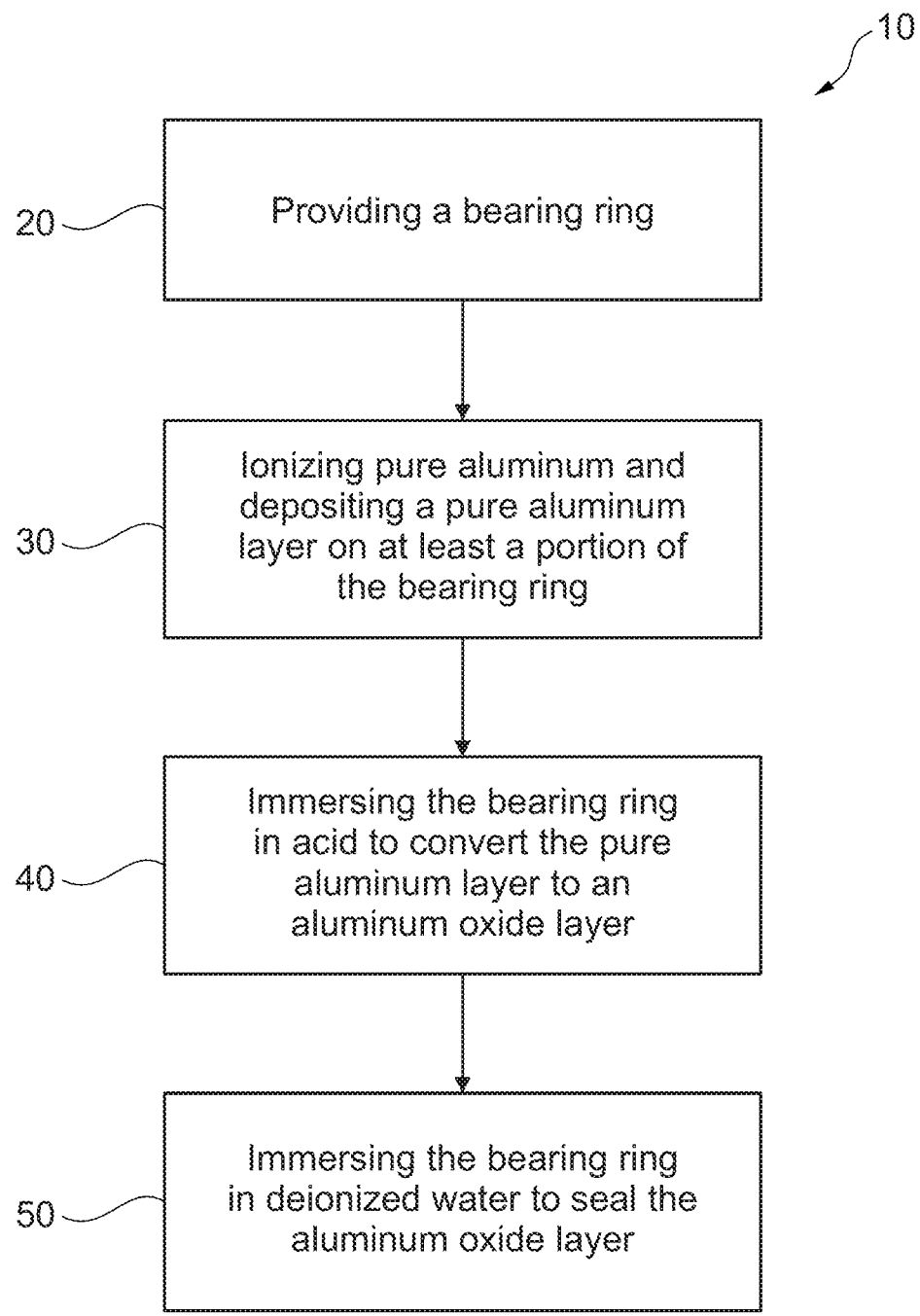
FIG. 1 is a flow diagram illustrating the steps of a method for providing EDM protection for a bearing.

Certain terminology is used in the following description for convenience only and is not limiting. The words "inner," "outer," "inwardly," and "outwardly" refer to directions towards and away from the parts referenced in the drawings. A reference to a list of items that are cited as "at least one of a, b, or c" (where a, b, and c represent the items being listed) means any single one of the items a, b, c or combinations thereof. The terminology includes the words specifically noted above, derivates thereof, and words of similar import.

As shown in FIG. 1, a method 10 of providing EDM protection for a bearing is provided. The method 10 includes providing a bearing ring, illustrated as step 20. The bearing ring is typically formed from bearing grade steel. The method 10 includes ionizing pure aluminum and depositing a pure aluminum layer on at least a portion of the bearing ring, illustrated as step 30. The pure aluminum preferably has an aluminum content of at least 99.9%. The method 10 includes immersing the bearing ring in acid to convert the pure aluminum layer to an aluminum oxide layer, illustrated as step 40. In one embodiment, the acid is sulfuric acid. In another embodiment, the acid is oxalic acid. One of ordinary skill in the art would recognize from the present disclosure that other acids can be used for oxidizing the aluminum.

Next, the method 10 includes immersing the bearing ring in deionized water to seal the aluminum oxide layer, illustrated as step 50. The deionized water is preferably at least 85° C. The bearing ring is preferably immersed in the deionized water for at least ten minutes. One of ordinary skill in the art would recognize from the present disclosure that the temperature of the deionized water bath and immersion time in the deionized water bath can be varied. After being treated, the aluminum oxide layer on the bearing ring provides an electrical insulator coating due to its relatively high electrical resistance compared to the underlying material of the bearing ring. The aluminum oxide layer on the bearing ring impedes electrical current from traveling through the bearing ring and rolling elements running on a raceway of the bearing ring while the bearing ring is mounted on a shaft or housing.

While the remainder of the bearing ring is coated to provide insulation from undesirable electric current and EDM, the raceway of the bearing ring requires a relatively greater hardness for supporting the rolling elements and cannot include the aluminum or aluminum oxide layers. The raceway of the bearing ring can either be masked or shielded during steps 20 and 30 to prevent aluminum from depositing on the raceway and aluminum oxide from being formed in this area. Alternatively, if the raceway of the bearing ring is not masked or shielded during steps 20 and 30, the raceway is machined after steps 20 and 30 to remove any deposited aluminum and aluminum oxide that is formed. Turning or grinding can be used to remove the aluminum and aluminum oxide from the raceway.

Figure 2:
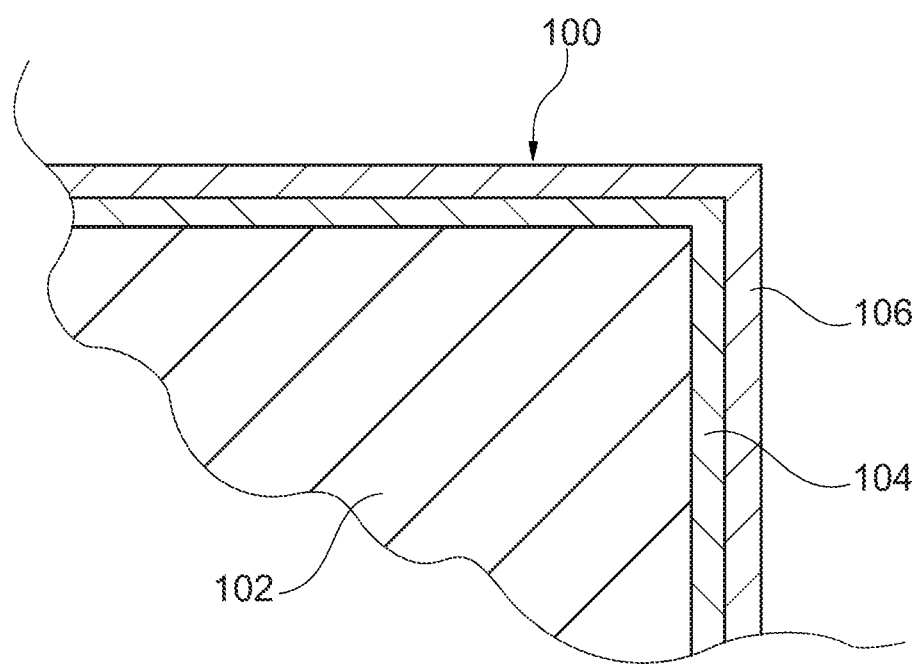
FIG. 2 is magnified view of a cross section of a bearing ring provided with EDM protection according to the present invention.

FIG. 2 illustrates a portion of a bearing ring 100 after being treated according to the method 10. This bearing ring 100 can be an inner bearing ring or an outer bearing ring. The bearing ring 100 includes an underlying steel substrate 102 with an aluminum layer 104 and an aluminum oxide layer 106. A thickness of the initial aluminum layer is preferably between 100 to 250 microns. In one embodiment, at least 75% of the aluminum layer is converted to aluminum oxide. The aluminum oxide layer 106 is preferably 150 microns thick. A thickness of the aluminum oxide layer is at least 50% of a thickness of the aluminum layer. Although the layers 104, 106 are shown as being roughly the same size, one of ordinary skill in the art would recognize from the present disclosure that the thickness of these layers can be varied.

Figure 3:
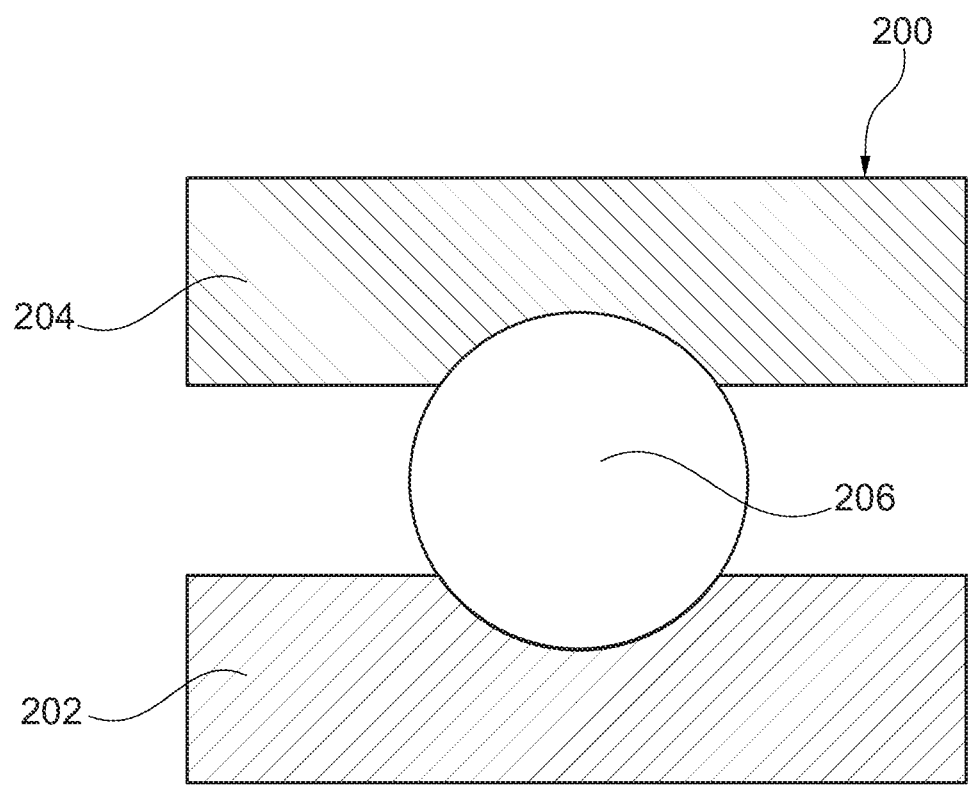
FIG. 3 is a cross section view of a bearing assembly including EDM protection.

In another embodiment, shown in FIG. 3, a rolling bearing assembly 200 is provided that includes an inner bearing ring 202 and an outer bearing 204 with a plurality of rolling elements 206 supported therebetween, and at least one of the inner bearing ring 202 or the outer bearing ring 204 is provided with EDM protection according to the method 10. One of ordinary skill in the art would recognize from the present disclosure that the inner bearing ring 202, the outer bearing ring 204, or both the inner and the outer bearing rings 202, 204 can be provided with EDM protection according to the method 10.

Having thus described various embodiments of the present method and bearing ring in detail, it will be appreciated and apparent to those skilled in the art that many changes, only a few of which are exemplified in the detailed description above, could be made in the method and bearing ring according to the invention without altering the inventive concepts and principles embodied therein. The present embodiments are therefore to be considered in all respects as illustrative and not restrictive, the scope of the invention being indicated by the appended claims rather than by the foregoing description, and all changes which come within the meaning and range of equivalency of the claims are therefore to be embraced therein.

What is claimed is:

1. A method of providing electrical discharge machining protection for a bearing, the method comprising:
   (a) providing a bearing ring;
   (b) ionizing pure aluminum and depositing a pure aluminum layer on at least a portion of the bearing ring;
   (c) immersing the bearing ring in acid to convert the pure aluminum layer to an aluminum oxide layer; and
   (d) immersing the bearing ring in deionized water to seal the aluminum oxide layer.

2. The method of claim 1, further comprising masking a raceway of the bearing ring during steps (b) and (c).

3. The method of claim 1, further comprising positioning the bearing ring such that a raceway of the bearing ring is shielded during steps (b) and (c).

4. The method of claim 1, further comprising removing the aluminum layer and the aluminum oxide layer from a raceway of the bearing ring.

5. The method of claim 4, wherein the removing step includes turning or grinding the raceway.

6. The method of claim 4, further comprising machining the raceway after forming the aluminum oxide layer.

7. The method of claim 1, wherein the pure aluminum has an aluminum content of at least 99.9% weight.

8. The method of claim 1, wherein the deionized water in step (d) is at least 85° C.

9. The method of claim 1, wherein the bearing ring is immersed during step (d) for at least 10 minutes.

10. The method of claim 1, wherein the aluminum oxide layer is at least 125 microns thick.

11. The method of claim 1, wherein the acid of step (c) is a sulfuric acid or an oxalic acid.

12. The method of claim 1, wherein the aluminum layer is between 100 to 250 microns thick.

13. The method of claim 1, wherein a thickness of the aluminum oxide layer is at least 50% of a thickness of the aluminum layer.

* * * * *